(12) United States Patent
Kubota et al.

(10) Patent No.: US 12,033,832 B2
(45) Date of Patent: *Jul. 9, 2024

(54) PLASMA PROCESSING METHOD AND PLASMA PROCESSING APPARATUS

(71) Applicant: Tokyo Electron Limited, Tokyo (JP)

(72) Inventors: Shinji Kubota, Miyagi (JP); Kazuya Nagaseki, Miyagi (JP); Shinji Himori, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 121 days.

This patent is subject to a terminal disclaimer.

(21) Appl. No.: 17/834,948

(22) Filed: Jun. 8, 2022

(65) Prior Publication Data

US 2022/0301825 A1  Sep. 22, 2022

Related U.S. Application Data

(63) Continuation of application No. 17/102,444, filed on Nov. 24, 2020, now Pat. No. 11,387,077.

(30) Foreign Application Priority Data

Nov. 26, 2019  (JP) ................................. 2019-213040

(51) Int. Cl.
*H01J 37/32* (2006.01)
(52) U.S. Cl.
CPC .. *H01J 37/32174* (2013.01); *H01J 37/32091* (2013.01); *H01J 37/32422* (2013.01)

(58) Field of Classification Search
None
See application file for complete search history.

(56) References Cited

U.S. PATENT DOCUMENTS

| 6,165,376 | A | 12/2000 | Miyake et al. | |
| 9,663,858 | B2 | 5/2017 | Nagami et al. | |
| 10,388,544 | B2 * | 8/2019 | Ui | ........................ H01L 21/3065 |
| 11,387,077 | B2 * | 7/2022 | Kubota | ............. H01J 37/32174 |

(Continued)

FOREIGN PATENT DOCUMENTS

| JP | 2000-277493 A | 10/2000 |
| JP | 2001-358129 A | 12/2001 |

(Continued)

*Primary Examiner* — Wilson Lee
(74) *Attorney, Agent, or Firm* — XSENSUS LLP (57) ABSTRACT

A disclosed plasma processing method includes generating plasma in a chamber of a plasma processing apparatus by supplying radio frequency power from a radio frequency power source in a first period. The plasma processing method further includes stopping supply of the radio frequency power from the radio frequency power source in a second period following the first period. The plasma processing method further includes applying a negative direct-current voltage from a bias power source to a substrate support in a third period following the second period. In the third period, the radio frequency power is not supplied. In the third period, the negative direct-current voltage is set to generate ions in a chamber by secondary electrons that are emitted by causing ions in the chamber to collide with a substrate.

19 Claims, 7 Drawing Sheets

(56) References Cited

U.S. PATENT DOCUMENTS

| | | | |
|---|---|---|---|
| 2011/0248634 A1* | 10/2011 | Heil | H01J 37/32009 |
| | | | 315/111.41 |
| 2013/0136872 A1* | 5/2013 | Booth | H01J 37/32091 |
| | | | 118/723 E |
| 2014/0361690 A1* | 12/2014 | Yamada | C23C 16/515 |
| | | | 315/111.21 |
| 2015/0000841 A1 | 1/2015 | Yamada et al. | |
| 2015/0000842 A1* | 1/2015 | Hirano | H01L 21/76802 |
| | | | 307/26 |
| 2015/0122420 A1 | 5/2015 | Konno et al. | |
| 2016/0056017 A1 | 2/2016 | Kim et al. | |
| 2016/0064194 A1 | 3/2016 | Tokashiki et al. | |
| 2019/0157040 A1* | 5/2019 | Fairbairn | H01J 37/3299 |
| 2020/0135527 A1* | 4/2020 | Sung | H01L 21/67213 |

FOREIGN PATENT DOCUMENTS

| | | |
|---|---|---|
| JP | 2009-187975 A | 8/2009 |
| JP | 2018-056248 A | 4/2018 |
| WO | 2014/050979 A | 4/2014 |

* cited by examiner

PLASMA PROCESSING METHOD AND PLASMA PROCESSING APPARATUS

CROSS-REFERENCE TO RELATED APPLICATIONS

This application is a continuation application of U.S. application Ser. No. 17/102,444, filed on Nov. 24, 2020, which is based on and claims the benefit of priority from Japanese Patent Application No. 2019-213040 filed on Nov. 26, 2019, the entire contents of each are incorporated herein by reference.

FIELD

Exemplary embodiments of the present disclosure relate to a plasma processing method and a plasma processing apparatus.

BACKGROUND

A plasma processing apparatus is used in plasma processing on a substrate. The plasma processing apparatus includes a chamber, a substrate support, and a radio frequency power source. The substrate support has a lower electrode and is configured to support a substrate in the chamber. The radio frequency power source supplies radio frequency power in order to generate plasma from gas in the chamber. Japanese Unexamined Patent Publication No. 2009-187975 discloses such a plasma processing apparatus.

The plasma processing apparatus disclosed in Japanese Unexamined Patent Publication No. 2009-187975 further includes a DC negative pulse generator. The DC negative pulse generator intermittently applies a pulse of a negative direct-current voltage to the lower electrode when radio frequency power is supplied from the radio frequency power source for generation of plasma.

SUMMARY

In an exemplary embodiment, a plasma processing method is provided. The plasma processing method includes generating plasma in a chamber of a plasma processing apparatus by supplying radio frequency power from a radio frequency power source in a first period. In the first period, a negative direct-current voltage is not applied from a bias power source to a substrate support provided in the chamber. The plasma processing method further includes stopping supply of the radio frequency power from the radio frequency power source in a second period following the first period. In the second period, the negative direct-current voltage is not applied from the bias power source to the substrate support. The plasma processing method further includes applying the negative direct-current voltage from the bias power source to the substrate support in a third period following the second period. In the third period, the radio frequency power is not supplied. In the third period, the negative direct-current voltage is set to generate ions in the chamber by secondary electrons that are emitted by causing ions in the chamber to collide with a substrate on the substrate support.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing method is provided. The plasma processing method includes generating plasma in a chamber of a plasma processing apparatus by supplying radio frequency power from a radio frequency power source in a first period. In the first period, a negative direct-current voltage is not applied from a bias power source to a substrate support provided in the chamber. The plasma processing method further includes stopping supply of the radio frequency power from the radio frequency power source in a second period following the first period. In the second period, the negative direct-current voltage is not applied from the bias power source to the substrate support. The plasma processing method further includes applying the negative direct-current voltage from the bias power source to the substrate support in a third period following the second period. In the third period, the radio frequency power is not supplied. In the third period, the negative direct-current voltage is set to generate ions in the chamber by secondary electrons that are emitted by causing ions in the chamber to collide with a substrate on the substrate support.

In the above embodiment, the density of electrons in the plasma generated in the first period rapidly decreases in the second period. In the third period, secondary electrons are emitted by collision of the ions in the plasma with the surface of the substrate. In the third period, the substrate is processed with ions which are generated by the emitted secondary electrons. In the third period, the radio frequency power is not supplied, and therefore, the reflection of the radio frequency power does not occur. Therefore, according to the above embodiment, the processing efficiency (for example, etching efficiency) of the substrate becomes high with respect to power consumption.

In an exemplary embodiment, a sequence that includes the generating plasma, the stopping supply of the radio frequency power, and the applying the negative direct-current voltage may be repeated.

In an exemplary embodiment, the plasma processing method may further include exhausting gas in the chamber in a state where the radio frequency power from the radio frequency power source is not supplied and a direct-current voltage is not applied from the bias power source to the substrate support. The exhausting gas is performed after performing a sequence one or more times. The sequence includes the generating plasma, the stopping supply of the radio frequency power, and the applying the negative direct-current voltage. According to the embodiment, byproducts generated during performing the sequence are efficiently exhausted by the exhausting gas.

In an exemplary embodiment, the performing a sequence one or more times and the exhausting gas may be alternately repeated.

In an exemplary embodiment, the plasma processing method may further include applying a positive direct-current voltage to the substrate support in the second period. In the embodiment, the electrons in the plasma can be reduced more rapidly. Therefore, it becomes possible to shorten the second period.

In an exemplary embodiment, an absolute value of the negative direct-current voltage that is applied to the substrate support in the third period may be 500 V or more.

In an exemplary embodiment, radicals from the plasma may adhere to the substrate on the substrate support in the first period. In the third period, the ions generated by the secondary electrons collide with the substrate, whereby the radicals and the ions may etch the substrate.

In another exemplary embodiment, a plasma processing apparatus comprising is provided. The plasma processing apparatus includes a chamber, a substrate support, a radio frequency power source, a bias power source, and a controller. The substrate support includes a base. The substrate support is configured to support a substrate in the chamber. The radio frequency power source is configured to supply radio frequency power to generate plasma from gas in the chamber. The bias power source is configured to apply a negative direct-current voltage to the substrate support. The controller is configured to control the radio frequency power source and the bias power source. The controller is configured to perform first control in a first period. The first control includes controlling the radio frequency power source to supply the radio frequency power to generate plasma in the chamber in a state where the negative direct-current voltage from the bias power source is not applied to the substrate support. The controller is configured to perform second control in a second period following the first period. The second control includes controlling the radio frequency power source to stop supply of the radio frequency power, in a state where the negative direct-current voltage from the bias power source is not applied to the substrate support. The controller is configured to perform third control in a third period following the second period. The third control includes controlling the bias power source to apply the negative direct-current voltage to the substrate support in a state where the radio frequency power from the radio frequency power source is not supplied. The negative direct-current voltage applied to the substrate support in the third period is set to generate ions in the chamber by secondary electrons that are emitted by causing ions in the chamber to collide with the substrate on the substrate support.

In an exemplary embodiment, the controller may be configured to repeatedly perform a control sequence that includes the first control, the second control, and the third control.

In an exemplary embodiment, the plasma processing apparatus may further include an exhaust device. The controller may be configured to perform fourth control after a control sequence that includes the first control, the second control, and the third control is performed one or more times. The fourth control includes controlling the exhaust device to exhaust gas in the chamber, in a state where the radio frequency power from the radio frequency power source is not supplied and a direct-current voltage is not applied from the bias power source to the substrate support.

In an exemplary embodiment, the controller may be configured to alternately repeat performing the control sequence one or more times and performing the fourth control.

In an exemplary embodiment, the second control may further include controlling the bias power source or another bias power source to apply a positive direct-current voltage to the substrate support in the second period.

In an exemplary embodiment, an absolute value of the negative direct-current voltage that is applied to the substrate support in the third period may be 500 V or more.

Hereinafter, various exemplary embodiments will be described in detail with reference to the drawings. In the drawings, the same or equivalent portions are denoted by the same reference symbols.

Figure 1:
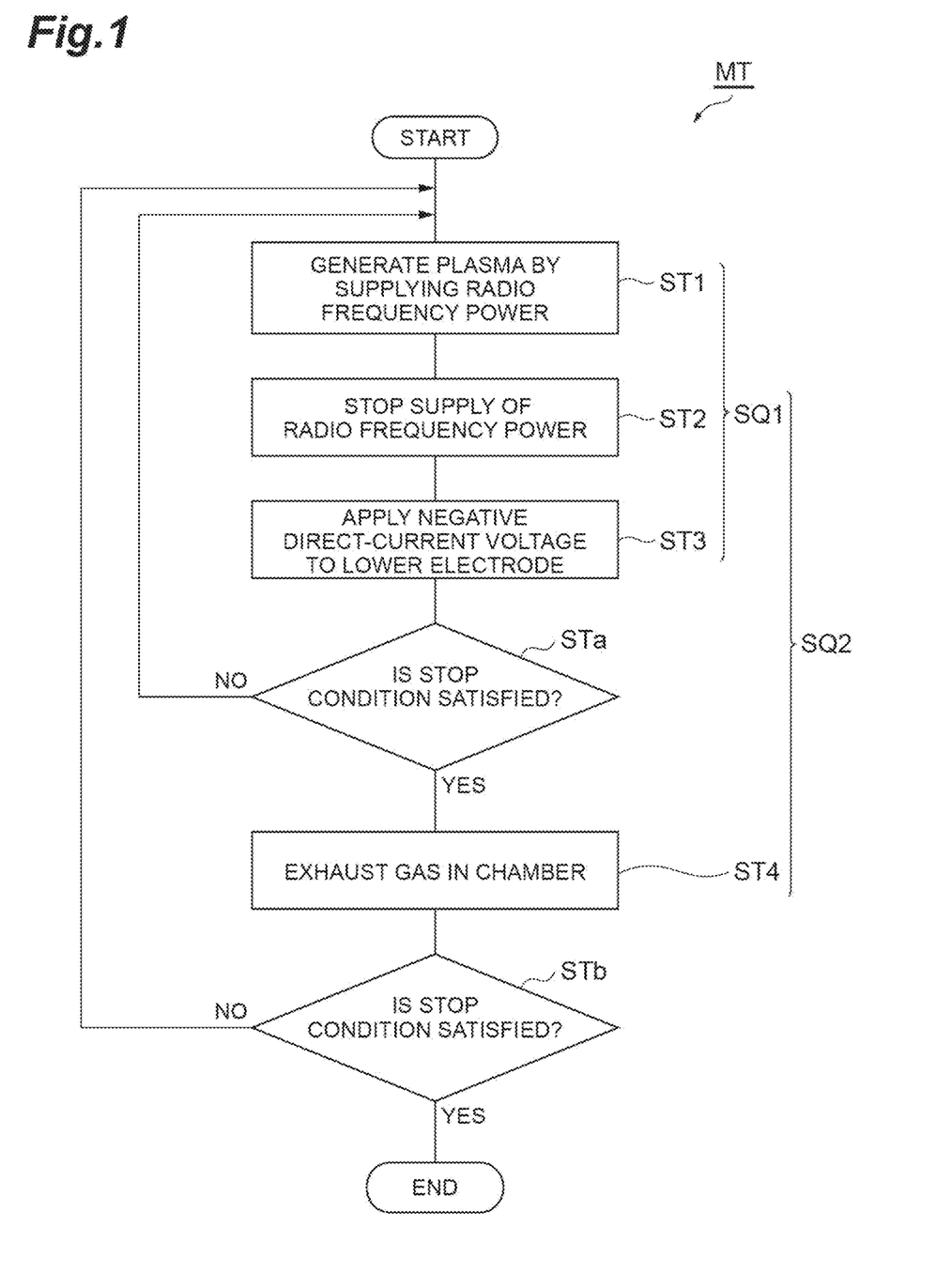
FIG. 1 is a flowchart of a plasma processing method according to an exemplary embodiment.

FIG. 1 is a flowchart of a plasma processing method according to an exemplary embodiment. The plasma processing method (hereinafter, referred to as a "method MT") shown in FIG. 1 is performed in order to perform plasma processing on a substrate in a plasma processing apparatus. The plasma processing in the method MT is, for example, plasma etching.

Figure 2:
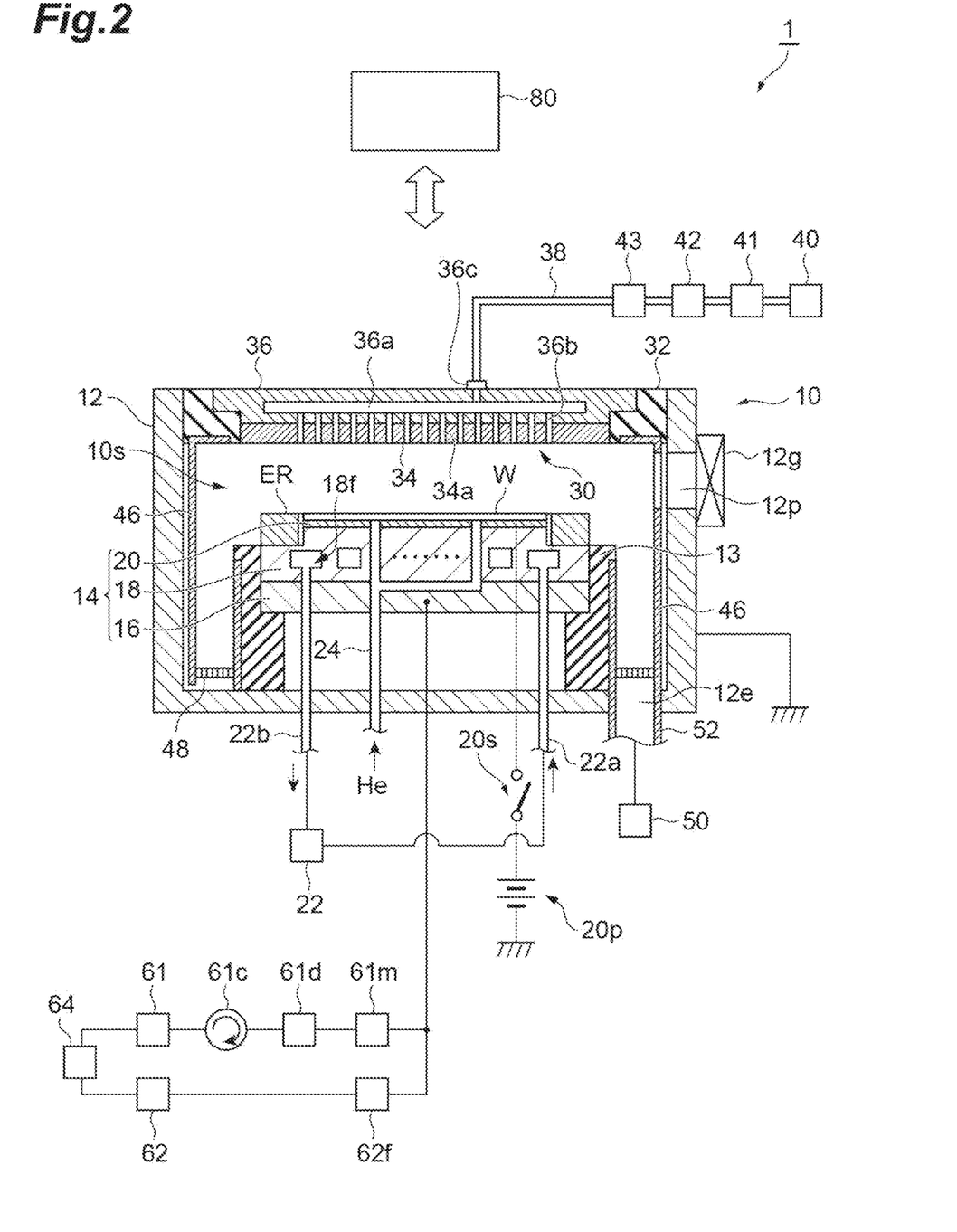
FIG. 2 is a diagram schematically showing a plasma processing apparatus according to an exemplary embodiment.

FIG. 2 is a diagram schematically showing a plasma processing apparatus according to an exemplary embodiment. The method MT may be performed using a plasma processing apparatus 1 shown in FIG. 2. The plasma processing apparatus 1 is a capacitively coupled plasma processing apparatus. The plasma processing apparatus 1 is provided with a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of, for example, aluminum. A film having corrosion resistance is provided on the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is made to be able to be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the internal space 10s.

The substrate support 14 includes a base 18 and an electrostatic chuck 20. The substrate support 14 may further include an electrode plate 16. The electrode plate 16, the base 18, and the electrostatic chuck 20 are provided in the chamber 10. The electrode plate 16 is formed of a conductor such as aluminum, for example, and has a substantially disk shape. The base 18 is provided on the electrode plate 16. The base 18 is formed of a conductor such as aluminum, for example, and has a substantially disk shape. The base 18 is electrically coupled to the electrode plate 16.

The electrostatic chuck 20 is provided on the base 18. The substrate W is placed on the upper surface of the electrostatic chuck 20. The electrostatic chuck 20 has a main body and an electrode. The main body of the electrostatic chuck 20 has a substantially disk shape and is formed of a dielectric. The electrode of the electrostatic chuck 20 is a film-shaped electrode and is provided in the main body of the electrostatic chuck 20. The electrode of the electrostatic chuck 20 is coupled to a direct-current power source 20p through a switch 20s. When the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

An edge ring ER is mounted on a peripheral edge portion of the substrate support 14. The edge ring ER is provided in order to improve the in-plane uniformity of plasma processing on the substrate W. The edge ring ER has a substantially plate-shaped and annular shape. The edge ring ER may be formed of silicon, silicon carbide, or quartz, but not limited thereto. The substrate W is disposed on the electrostatic chuck 20 and in a region surrounded by the edge ring ER.

A flow path 18f is provided in the interior of the base 18. A heat exchange medium (for example, a refrigerant) is supplied from a chiller unit 22 provided outside the chamber 10 to the flow path 18f through a pipe 22a. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the base 18.

The plasma processing apparatus 1 is provided with a gas supply line 24. The gas supply line 24 supplies a heat transfer gas (for example, He gas) from a heat transfer gas supply mechanism to the gap between the upper surface of the electrostatic chuck 20 and the back surface of the substrate W.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 may be formed of a low resistance conductor or semiconductor with low Joule heat. A plurality of gas discharge holes 34a are formed in the ceiling plate 34. The plurality of gas discharge holes 34a penetrate the ceiling plate 34 in a plate thickness direction thereof.

The support 36 detachably supports the ceiling plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b respectively communicate with the plurality of gas discharge holes 34a. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents an etching byproduct from adhering to the chamber body 12. The shield 46 is configured, for example, by forming a film having corrosion resistance on the surface of a member formed of aluminum. The film having corrosion resistance may be a film formed of ceramic such as yttrium oxide.

A baffle plate 48 is provided between the support 13 and the side wall of the chamber body 12. The baffle plate 48 is configured, for example, by forming a film having corrosion resistance on the surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a radio frequency power source 61. The radio frequency power source 61 is configured to generate radio frequency power HF. The frequency of the radio frequency power HF is a frequency in the range of 13 MHz or more and 200 MHz or less, for example. The radio frequency power source 61 supplies the radio frequency power HF in order to generate plasma from the gas in the chamber 10.

In one embodiment, the radio frequency power source 61 is electrically coupled to the base 18 through a matcher 61m and the base 18 functions as lower electrode. The matcher 61m has a matching circuit. The matching circuit of the matcher 61m is configured to match the impedance on the load side (base side) of the radio frequency power source 61 with the output impedance of the radio frequency power source 61. In another embodiment, the radio frequency power source 61 may be electrically coupled to the upper electrode 30 through the matcher 61m.

A circulator 61c and a directional coupler 61d may be coupled between the radio frequency power source 61 and the matcher 61m. The circulator 61c has first to third ports.

The circulator 61c receives the radio frequency power HF from the radio frequency power source 61 at the first port, and outputs the radio frequency power HF from the second port toward the load (that is, the base 18 or the upper electrode 30) of the radio frequency power source 61. The circulator 61c outputs a reflected wave received by the second port from the third port to prevent the reflected wave from being returned to the radio frequency power source 61. The directional coupler 61d outputs a portion of a traveling wave of the radio frequency power HF and a portion of a reflected wave from the load of the radio frequency power source 61. The power of the portion of the traveling wave and the power of the portion of the reflected wave are used for load power control in a controller 80 (described later).

The plasma processing apparatus 1 further includes a bias power source 62. The bias power source 62 is electrically coupled to the substrate support 14. In an embodiment, the bias power source 62 is electrically coupled to the base 18. In an embodiment, the bias power source 62 is coupled to the base 18 through a filter 62F The filter 62f is a low-pass filter configured to prevent the inflow of radio frequency wave into the bias power source 62. The bias power source 62 is configured to generate a negative direct-current voltage $V_B$ in order to draw ions to the substrate support 14. The negative direct-current voltage $V_B$ is applied to the base 18.

The plasma processing apparatus 1 further includes the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, a visualized operating status of the plasma processing apparatus 1 can be displayed by the display device. Further, a control program and recipe data are stored in the storage unit of the controller 80. The control program is executed by the processor of the controller 80 in order to perform various processing in the plasma processing apparatus 1. The processor of the controller 80 executes the control program and controls each part of the plasma processing apparatus 1 according to the recipe data, whereby the method MT may be performed in the plasma processing apparatus 1.

Figure 3:
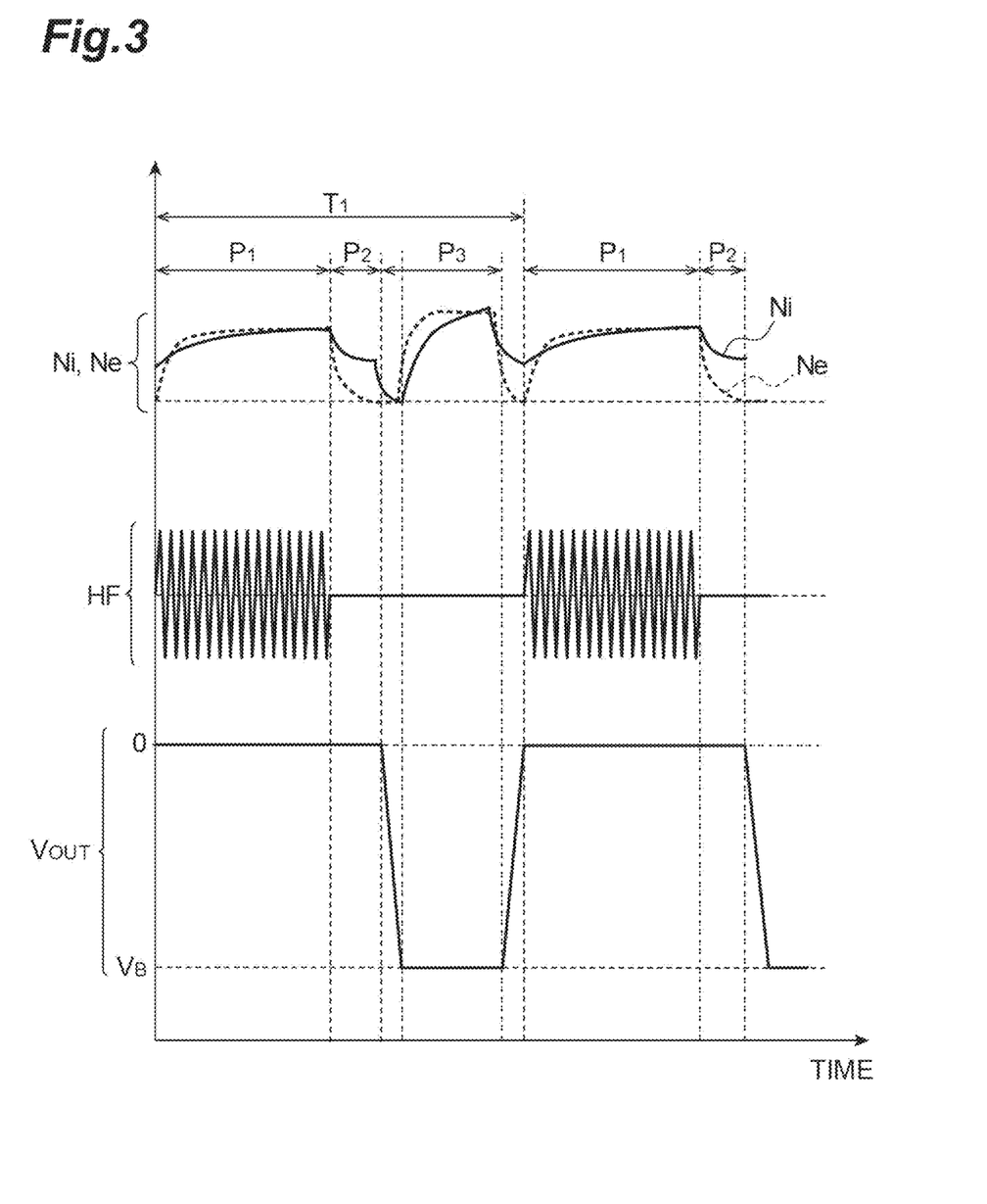
FIG. 3 is a timing chart of an example of radio frequency power, a direct-current voltage, electron density, and ion density.
Figure 4:
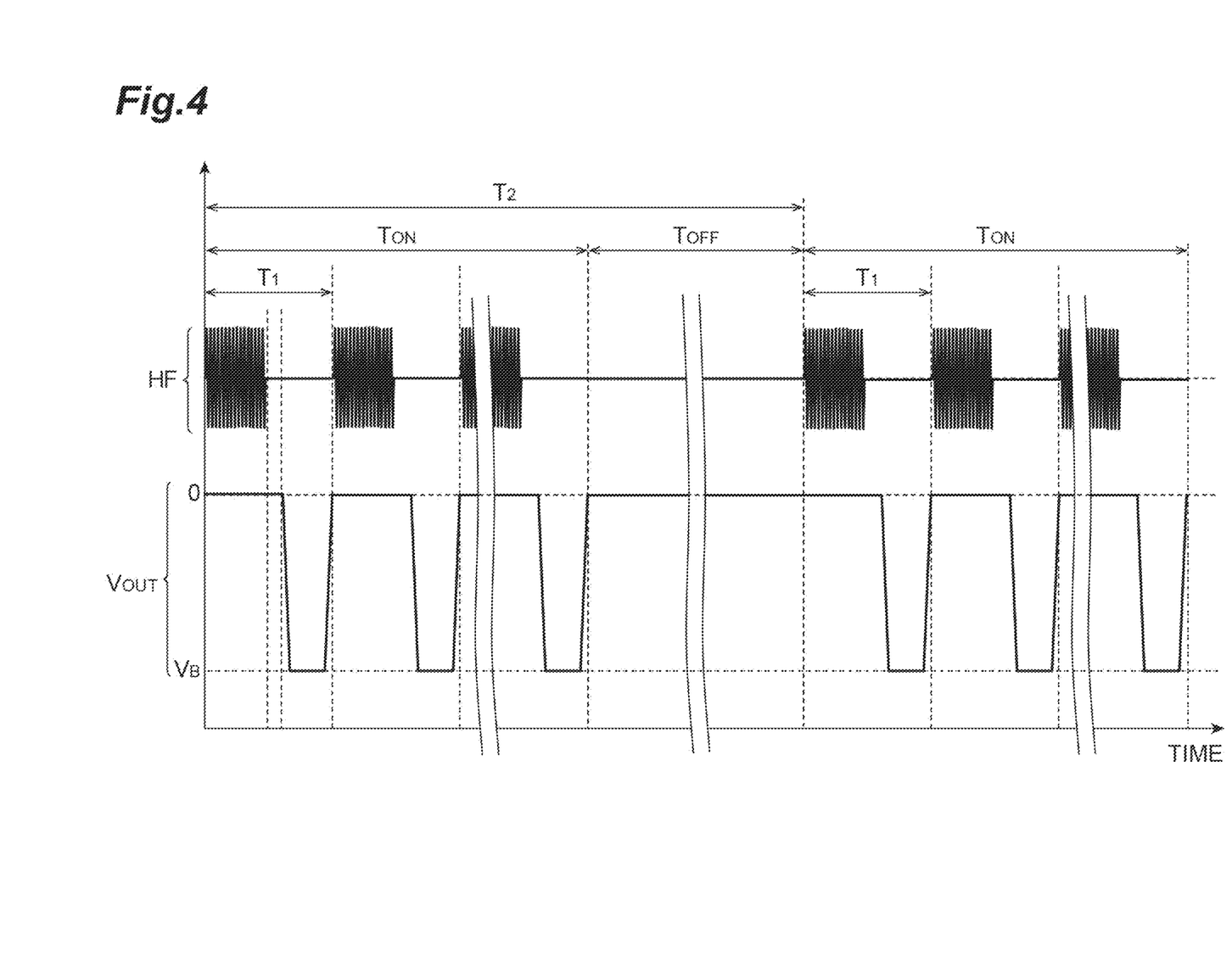
FIG. 4 is a timing chart of an example of the radio frequency power and the direct-current voltage.

Hereinafter, FIGS. 3 and 4 will be referred to together with FIG. 2. FIG. 3 is a timing chart of an example of radio frequency power, a direct-current voltage, electron density, and ion density. FIG. 4 is a timing chart of an example of the radio frequency power and the direct-current voltage. In FIGS. 3 and 4, $V_{OUT}$ represents the output voltage of the bias power source 62. In FIG. 3, Ne represents the electron density in the chamber 10, and Ni represents the ion density in the chamber 10.

As shown in FIG. 3, the radio frequency power source 61 supplies the radio frequency power HF in a first period $P_1$. The radio frequency power source 61 stops the supply of the radio frequency power HF in a second period $P_2$ following the first period $P_1$ and a third period $P_3$ following the second period $P_2$. That is, the radio frequency power source 61 supplies a pulse of the radio frequency power HF. The pulse of the radio frequency power HF is sustained in the first period $P_1$ among the first to third periods.

The bias power source 62 applies the negative direct-current voltage $V_B$ to the base 18 in the third period $P_3$ among the first to third periods. The bias power source 62 stops the application of the negative direct-current voltage $V_B$ to the base 18 in the first period $P_1$ and the second period $P_2$.

The radio frequency power source 61 and the bias power source 62 are controlled by the controller 80. The controller 80 performs first control in the first period $P_1$. The first control includes controlling the radio frequency power source 61 to supply the radio frequency power HF in order to generate plasma in the chamber 10, in a state where the negative direct-current voltage $V_B$ from the bias power source 62 is not applied to the base 18. The first control may further include controlling the bias power source 62 to stop the application of the negative direct-current voltage $V_B$ to the base 18. The first control may further include controlling a gas supply unit to supply a selected gas into the chamber 10 and controlling the exhaust device 50 to set the pressure of the gas in the chamber 10 to a specified pressure. In the first period $P_1$, plasma is generated from the gas in the chamber 10 by a radio frequency electric field by the radio frequency power HF.

The controller 80 performs second control in the second period $P_2$. The second control includes controlling the radio frequency power source 61 to stop the supply of the radio frequency power HF, in a state where the negative direct-current voltage $V_B$ from the bias power source 62 is not applied to the base 18. The second control may further include controlling the bias power source 62 to continue a state where the application of the negative direct-current voltage $V_B$ to the base 18 is stopped. The second control may further include controlling the gas supply unit to supply a selected gas into the chamber 10 and controlling the exhaust device 50 to set the pressure of the gas in the chamber 10 to a specified pressure. A time length of the second period $P_2$ is set in advance such that although the ions in the plasma generated in the first period $P_1$ remain in the chamber 10, the electrons in the plasma substantially disappear.

The controller 80 performs third control in the third period $P_3$. The third control includes controlling the bias power source 62 to apply the negative direct-current voltage $V_B$ to the base 18 in a state where the radio frequency power HF from the radio frequency power source 61 is not supplied. That is, the bias power source 62 applies a pulse of the negative direct-current voltage $V_B$ to the base 18. The pulse of the negative direct-current voltage $V_B$ is sustained in the third period $P_3$ among the first to third periods. The third control may further include controlling the radio frequency power source 61 to continue a state where the supply of the radio frequency power HF is stopped. The third control may further include controlling the gas supply unit to supply a selected gas into the chamber 10 and controlling the exhaust device 50 to set the pressure of the gas in the chamber 10 to a specified pressure. In the third control, that is, in the third period $P_3$, the negative direct-current voltage $V_B$ is set in advance such that ions are generated in the chamber 10 by secondary electrons which are emitted by causing the ions in the chamber 10 to collide with the substrate W on the substrate support 14. The absolute value of the negative direct-current voltage $V_B$ is, for example, 500 V or more. In the third period $P_3$, the ions generated by the secondary electrons are accelerated toward the substrate W by bias which is generated by the negative direct-current voltage $V_B$.

In an embodiment, the controller 80 may repeatedly perform a control sequence which includes the first control, the second control, and the third control. That is, as shown in FIGS. 3 and 4, the radio frequency power source 61 may supply the pulse of the radio frequency power HF repeatedly, that is, periodically with a first cycle $T_1$. In the present embodiment, the bias power source 62 may also apply the negative direct-current voltage $V_B$ to the base 18 repeatedly, that is, periodically with the first cycle $T_1$. The first cycle $T_1$ may be a cycle which is defined by a frequency of 100 kHz or more and 800 kHz or less.

In an embodiment, the controller 80 may perform fourth control after the control sequence is performed one or more times. The fourth control includes controlling the exhaust device 50 to exhaust the gas in the chamber 10 in a state where the radio frequency power HF from the radio frequency power source 61 is not supplied and a direct-current voltage is not applied from the bias power source 62 to the base 18. That is, as shown in FIG. 4, the controller 80 performs the control sequence one or more times in a period $T_{ON}$ and performs the fourth control in a period $T_{OFF}$ following the period $T_{ON}$. In the period $T_{ON}$, the control sequence may be periodically performed with the first cycle $T_1$. Further, the controller 80 may alternately repeat performing the control sequence one or more times and performing the fourth control. That is, the controller 80 may periodically perform another control sequence which includes performing the control sequence one or more times and performing the fourth control, with a second cycle $T_2$. The second cycle $T_2$ may be a cycle which is defined by a frequency of 1 kHz or more and 40 kHz or less.

Figure 5:
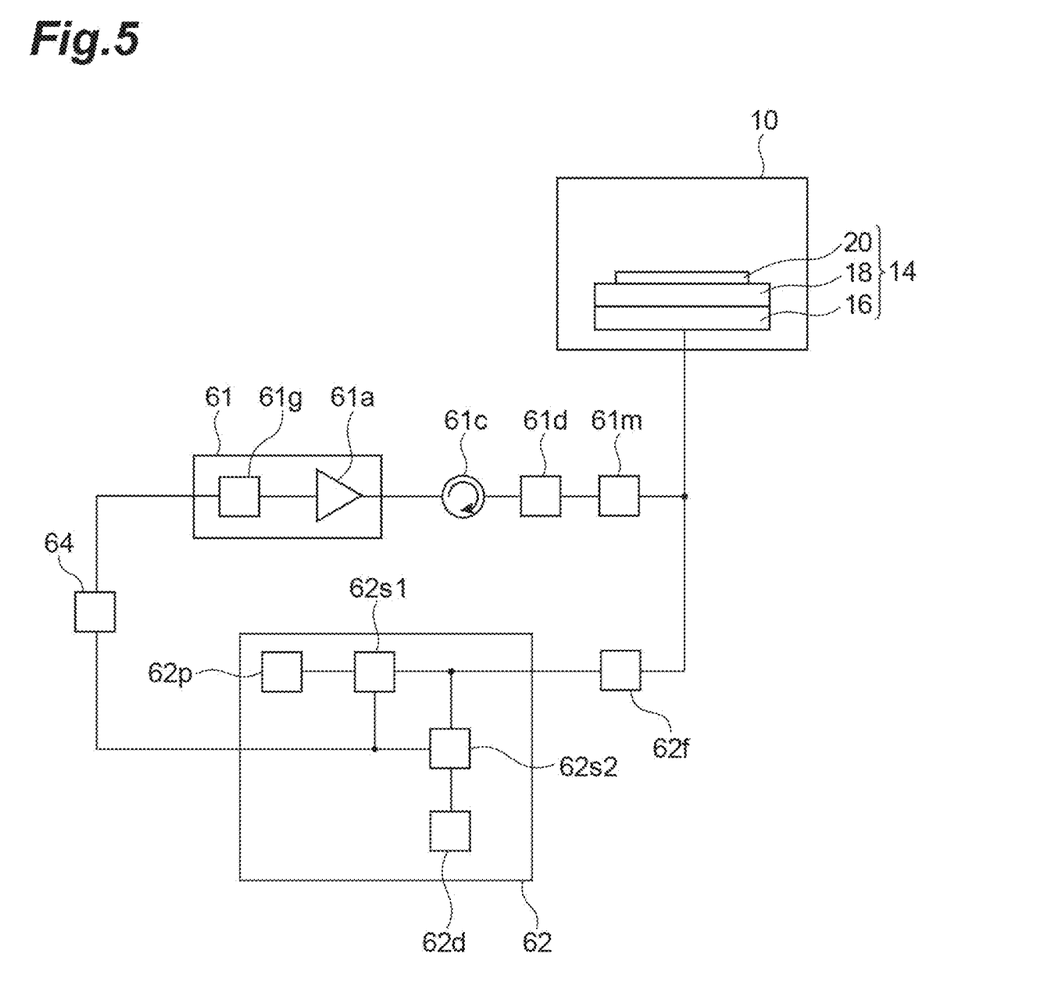
FIG. 5 is a diagram showing configurations of a radio frequency power source and a bias power source of the plasma processing apparatus according to an exemplary embodiment.

Hereinafter, FIG. 5 will be referred to. FIG. 5 is a diagram showing the configurations of the radio frequency power source and the bias power source of the plasma processing apparatus according to an exemplary embodiment. In an embodiment, the radio frequency power source 61 may include a radio frequency signal generator 61g and an amplifier 61a. The radio frequency signal generator 61g generates a radio frequency signal. The frequency of the radio frequency signal is the same as the frequency of the radio frequency power HF. The output of the radio frequency signal generator 61g is coupled to the amplifier 61a. The amplifier 61a amplifies the radio frequency signal from the radio frequency signal generator 61g to output the radio frequency power HF.

The plasma processing apparatus 1 may further include a synchronization signal generator 64. The controller 80 controls the synchronization signal generator 64 to generate a first synchronization signal synchronized with the point in time of the start and the point in time of the end of the first period $P_1$. The radio frequency signal generator 61g starts the generation of the radio frequency signal at the point in time of the start of the first period $P_1$ and stops the generation of the radio frequency signal at the point in time of the end of the first period $P_1$, in response to the first synchronization signal. By such control of the radio frequency power source 61 by the controller 80, the radio frequency power HF is supplied in the first period $P_1$.

In an embodiment, the bias power source 62 may have a direct-current power source 62p, a switching element 62s1, a switching element 62s2, and a dummy load 62d. The direct-current power source 62p is a direct-current power source that generates the negative direct-current voltage $V_B$. The direct-current power source 62p may be a variable direct-current power source.

The direct-current power source 62p is electrically coupled to the base 18 through the switching element 62s1. The voltage from the direct-current power source 62p is applied to the base 18 when the switching element 62s1 is in a conduction state. On the other hand, when the switching element 62s1 is in a non-conduction state, the voltage from the direct-current power source 62p is not applied to the base 18.

The switching element 62s2 is coupled between a node on an electrical path between the direct-current power source 62p and the base 18 and the dummy load 62d. When the switching element 62s2 is in a conduction state, the potential of the base 18 is rapidly set to the ground potential.

The controller 80 controls the synchronization signal generator 64 to generate a second synchronization signal synchronized with the point in time of the start and the point in time of the end of the third period $P_3$. The second synchronization signal is supplied to the switching element 62s1 and the switching element 62s2. The switching element 62s1 enters the conduction state at the point in time of the start of the third period $P_3$ and enters the non-conduction state at the point in time of the end of the third period $P_3$, in response to the second synchronization signal. The switching element 62s2 enters the non-conduction state at the point in time of the start of the third period $P_3$ and enters the conduction state at the point in time of the end of the third period $P_3$, in response to the second synchronization signal.

Figure 6A:
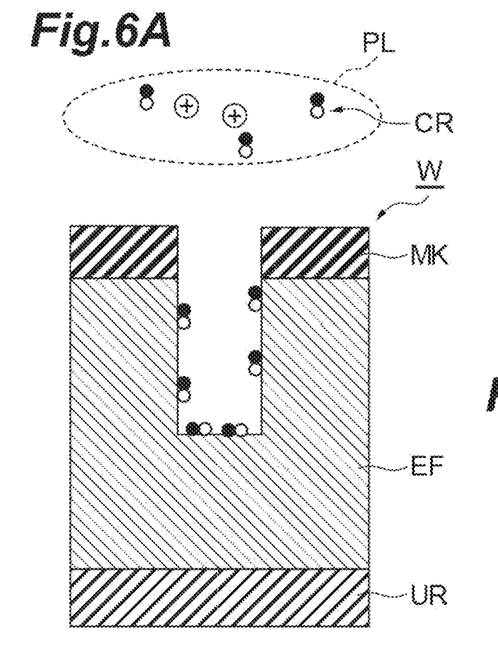
FIG. 6A is a diagram showing an example of a state of plasma and behavior of radicals in a first period.
Figure 6B:
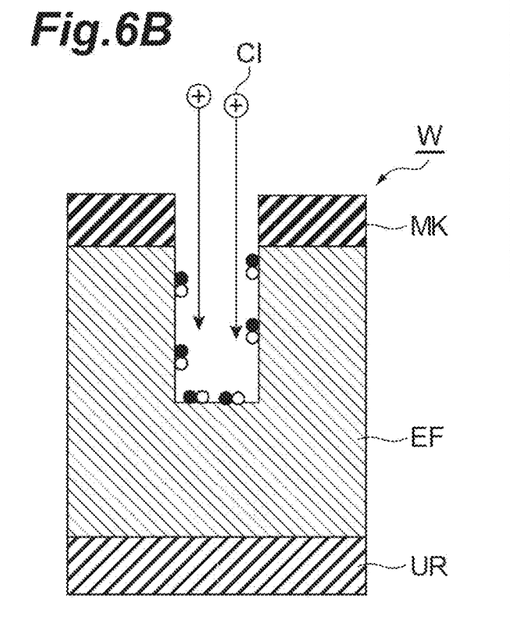
FIG. 6B is a diagram showing an example of behavior of ions in a third period.
Figure 6C:
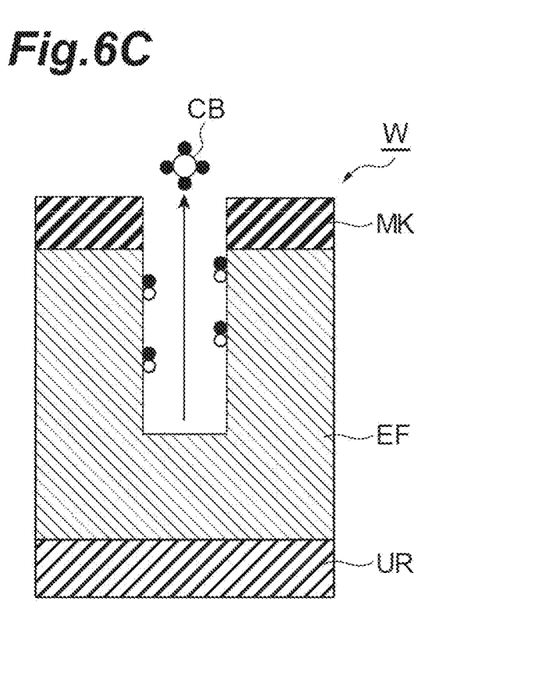
FIG. 6C is a diagram showing an example of behavior of a byproduct in exhaust after the third period.

FIG. 1 will be referred to again. Further, FIGS. 6A, 6B, and 6C will be referred to, in addition to FIG. 1. FIG. 6A is a diagram showing an example of the state of plasma and the behavior of radicals in the first period, FIG. 6B is a diagram showing an example of the behavior of ions in the third period, and FIG. 6C is a diagram showing an example of the behavior of a byproduct in the exhaust after the third period. In FIGS. 6A, 6B, and 6C, a part of the substrate W is also shown. The substrate W has an underlying region UR, a film EF, and a mask MK. The film EF is provided on the underlying region UR. The mask MK is provided on the film EF and has a pattern that partially exposes the surface of the film EF. Hereinafter, the method MT will be described in detail by taking the case of using the plasma processing apparatus 1 as an example.

The method MT starts in step ST1. Step ST1 is performed in the first period $P_1$. By performing step ST1, the radio frequency power HF is supplied from the radio frequency power source 61 in the first period $P_1$. In the first period P1, the negative direct-current voltage $V_B$ is not applied from the bias power source 62 to the base 18. As shown in FIG. 6A, by performing step ST1, plasma PL is generated in the chamber 10 in the first period $P_1$. Gas is dissociated by a radio frequency electric field which is generated by the supply of the radio frequency power HF and the generated electrons collide with the molecules and/or atoms in the gas, whereby the plasma PL is generated. That is, in the first period $P_1$, the plasma PL is generated in an a mode. In the first period $P_1$, radicals CR from the plasma PL adhere to the surface of the film EF. In order to perform step ST1, the controller 80 performs the first control described above.

Subsequent step ST2 is performed in the second period $P_2$. By performing step ST2, the supply of the radio frequency power HF from the radio frequency power source 61 is stopped in the second period $P_2$. In the second period $P_2$, the negative direct-current voltage $V_B$ is not applied from the bias power source 62 to the base 18. As shown in FIG. 3, although the ions in the plasma PL generated in the first period $P_1$ remain in the chamber 10 even after the end of the second period $P_2$, the electrons in the plasma PL rapidly decrease in the second period $P_2$ and substantially disappear. In order to perform step ST2, the controller 80 performs the second control described above.

Subsequent step ST3 is performed in the third period $P_3$. By performing step ST3, the negative direct-current voltage $V_B$ is applied from the bias power source 62 to the base 18 in the third period $P_3$. In the third period $P_3$, the radio frequency power HF is not supplied. When the negative direct-current voltage $V_B$ is applied to the base 18 in the third period $P_3$, ions CI are accelerated toward the substrate W and collide with the surface of the substrate W. As a result, secondary electrons are emitted from the surface of the substrate W. In the third period $P_3$, the emitted secondary electrons collide with the molecules and/or atoms in the gas, whereby ions are generated in the chamber 10. As a result, as shown in FIG. 3, in the third period $P_3$, the density of the ions in the chamber 10 increases. That is, in the third period $P_3$, plasma is generated in a γ mode. The absolute value of the negative direct-current voltage $V_B$ at which the γ mode occurs is, for example, 500 V or more.

In the third period $P_3$, the ions CI which are generated by the collision of the secondary electrons with the molecules and/or atoms in the gas are accelerated toward the substrate W, as shown in FIG. 6B, due to the bias based on the negative direct-current voltage $V_B$. As a result, the substrate W is processed. In an example, the film EF of the substrate W is etched. In this example, the ions CI collide with the substrate W to cause the reaction between the ions CI and/or the radicals CR and the material of the film EF, whereby the film EF is etched. By this reaction, a byproduct CB is generated (refer to FIG. 6C). In order to perform step ST3, the controller 80 performs the third control described above.

In the third period $P_3$, the radio frequency power HF is not supplied, and therefore, the reflection of the radio frequency power HF does not occur. Therefore, according to the method MT and the plasma processing apparatus 1, the processing efficiency (for example, etching efficiency) of the substrate W becomes high with respect to power consumption.

The plasma generated in the γ mode has a feature that an ion current is larger than that of the plasma generated in the α mode. The larger the ion current, the higher the etching rate becomes. Therefore, according to the etching of the film EF using the plasma generated in the γ mode in the third period $P_3$, a high etching rate can be obtained. Further, the electron temperature of the plasma generated in the γ mode is lower than the electron temperature of the plasma generated in the α mode. In a case where the electron temperature is low, the dissociation of the molecules and/or atoms in the gas is suppressed and heavy ions are generated. The heavy ions may be drawn substantially vertically to the bottom of an opening formed in the film EF. Therefore, by using the plasma generated in the γ mode in the third period $P_3$, it becomes possible to etch the film EF to substantially vertically form an opening having a high aspect ratio. Further, the opening which is formed in the film EF may be restrained from being expanded in a lateral direction.

In an embodiment, a sequence SQ1 which includes steps ST1 to ST3 may be repeated. The repetition cycle of the sequence SQ1 is the first cycle $T_1$ described above. In the present embodiment, the method MT includes step STa. In step STa, whether or not a stop condition is satisfied is determined. The stop condition is satisfied in a case where the number of times by which the sequence SQ1 is performed reaches a predetermined number of times. When in step STa, it is determined that the stop condition is not satisfied, the sequence SQ1 is performed again. When in step STa, it is determined that the stop condition is satisfied, the repetition of the sequence SQ1 ends. In order to repeat the sequence SQ1, the controller 80 repeats the control sequence described above.

In an embodiment, the method MT may further include step ST4. Step ST4 is performed after the sequence SQ1 is performed one or more times. In step ST4, the gas in the chamber 10 is exhausted by the exhaust device 50. Step ST4 is performed in a state where the radio frequency power HF from the radio frequency power source 61 is not supplied and the negative direct-current voltage $V_B$ is not applied from the bias power source 62 to the base 18. In step ST4, the byproduct CB is discharged from the chamber 10, as shown in FIG. 6C. That is, the byproduct CB generated in the sequence SQ1 is efficiently discharged from the chamber 10 by performing step ST4.

In an embodiment, performing the sequence SQ1 one or more times and performing step ST4 may be alternately repeated. That is, a sequence SQ2 which includes performing the sequence SQ1 one or more times and performing step ST4 may be repeated. The repetition cycle of the sequence SQ2 is the second cycle $T_2$ described above. In the present embodiment, the method MT further includes step STb. In step STb, whether or not a stop condition is satisfied is determined. The stop condition is satisfied in a case where the number of times by which the sequence SQ2 is performed reaches a predetermined number of times. When in step STb, it is determined that the stop condition is not satisfied, the sequence SQ2 is performed again. When in step STb, it is determined that the stop condition is satisfied, the repetition of the sequence SQ2 ends.

Figure 7:
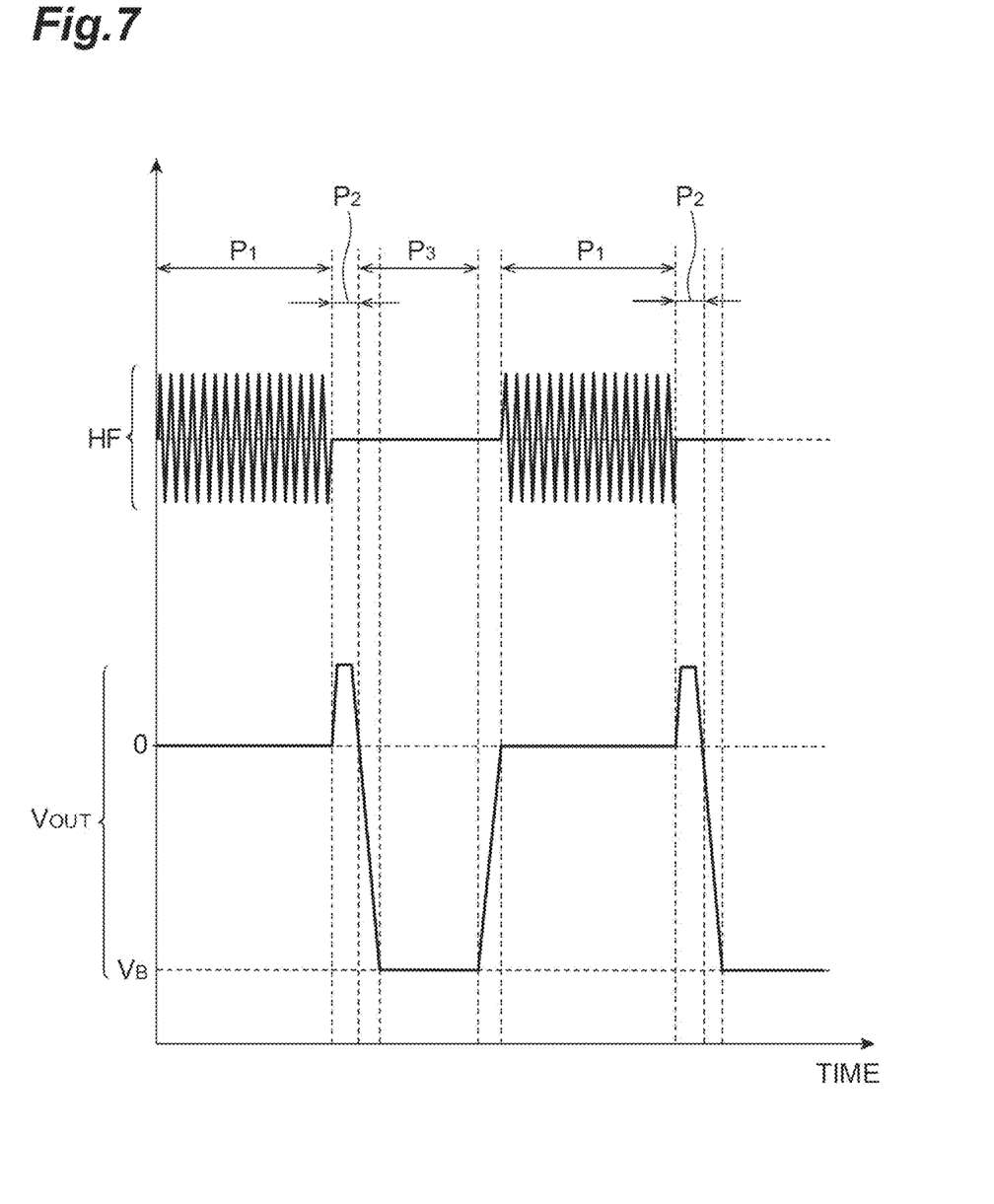
FIG. 7 is a timing chart of another example of the radio frequency power and the direct-current voltage.

Hereinafter, FIG. 7 will be referred to. FIG. 7 is a timing chart of another example of the radio frequency power and the direct-current voltage. In another embodiment, as shown in FIG. 7, in the second period $P_2$, a positive direct-current voltage may be applied to the base 18 by the bias power source 62. The positive direct-current voltage may be applied from another bias power source to the base 18 in the second period $P_2$. According to this embodiment, the electrons in the plasma PL can be reduced more rapidly. Therefore, it becomes possible to shorten the second period $P_2$.

In FIGS. 3, 4 and 7, the negative direct-current voltage $V_B$ is indicated as constant voltage value during the third period $P_3$, but not limited thereto. The negative direct-current voltage $V_B$ may include several voltage values. The positive direct-current voltage indicated in FIG. 7 may also include several voltage values.

While various exemplary embodiments have been described above, various additions, omissions, substitutions and changes may be made without being limited to the exemplary embodiments described above. Elements of the different embodiments may be combined to form another embodiment.

In another embodiment, the plasma processing apparatus may be another type of plasma processing apparatus such as an inductively coupled plasma processing apparatus. In the inductively coupled plasma processing apparatus, the radio frequency power HF is supplied to an antenna for generating inductively coupled plasma.

In another embodiment, one or more bias-electrode may be embedded in the main body of the electrostatic chuck 20 and coupled to bias power source 62 for the negative direct-current voltage (and another bias power source for the positive direct-current voltage). The bias-electrode may be the electrode of the electrostatic chuck From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support in the chamber, the substrate support including a lower electrode;
   an upper electrode disposed above the substrate support;
   an RF source configured to supply an RF power to the lower electrode or the upper electrode, the RF power including a plurality of power levels during a repeating time period, the plurality of power levels including a first power level during a first state, a second power level during a second state, and a third power level during a third state, the second power level and the third power level being equal to zero power level; and
   a DC source configured to apply a DC voltage to the lower electrode, the DC voltage including a plurality of voltage levels during the repeating time period, the plurality of voltage levels including a first voltage level during the first state, a second voltage level during the second state, and a third voltage level during the third state, the first voltage level being equal to zero voltage level.

2. The plasma processing apparatus according to claim 1, wherein the third voltage level has a negative polarity.

3. The plasma processing apparatus according to claim 2, wherein an absolute value of the third voltage level is 500 V or more.

4. The plasma processing apparatus according to claim 2, wherein the second voltage level is equal to zero voltage level.

5. The plasma processing apparatus according to claim 2, wherein the second voltage level has a positive polarity.

6. The plasma processing apparatus according to claim 5, wherein an absolute value of the third voltage level is greater than an absolute value of the second voltage level.

7. The plasma processing apparatus according to claim 6, wherein the absolute value of the third voltage level is 500 V or more.

8. The plasma processing apparatus according to claim 1, wherein the repeating time period is repeated with a repeating frequency in a range of 100 kHz to 800 kHz.

9. The plasma processing apparatus according to claim 1, wherein the RF power has a frequency in a range of 13 MHz to 200 MHz.

10. A plasma processing apparatus comprising:
    a chamber;
    a substrate support in the chamber;
    an RF source configured to supply an RF power to generate a plasma from a gas in the chamber, the RF power including a plurality of power levels during a repeating time period, the plurality of power levels including a first power level during a first state, a second power level during a second state, and a third power level during a third state, the second power level and the third power level being equal to zero power level; and
    a DC source configured to apply a DC voltage to the substrate support, the DC voltage including a plurality of voltage levels during the repeating time period, the plurality of voltage levels including a first voltage level during the first state, a second voltage level during the second state, and a third voltage level during the third state, the first voltage level being equal to zero voltage level.

11. The plasma processing apparatus according to claim 10, wherein the third voltage level has a negative polarity.

12. The plasma processing apparatus according to claim 11, wherein the second voltage level is equal to zero voltage level.

13. The plasma processing apparatus according to claim 11, wherein the second voltage level has a positive polarity.

14. The plasma processing apparatus according to claim 13, wherein an absolute value of the third voltage level is greater than an absolute value of the second voltage level.

15. A system comprising:
    an RF generator configured to generate an RF power, the RF power including a plurality of power levels during a repeating time period, the plurality of power levels including a first power level during a first state, a second power level during a second state, and a third power level during a third state, the second power level and the third power level being equal to zero power level; and
    a DC generator configured to generate a DC voltage, the DC voltage including a plurality of voltage levels during the repeating time period, the plurality of voltage levels including a first voltage level during the first state, a second voltage level during the second state, and a third voltage level during the third state, the first voltage level being equal to zero voltage level.

16. The system according to claim 15, wherein the third voltage level has a negative polarity.

17. The system according to claim 16, wherein the second voltage level is equal to zero voltage level.

18. The system according to claim 16, wherein the second voltage level has a positive polarity.

19. The system according to claim 18, wherein an absolute value of the third voltage level is greater than an absolute value of the second voltage level.

* * * * *